United States Patent [19]

Winkler

[11] 4,168,527

[45] Sep. 18, 1979

[54] ANALOG AND DIGITAL CIRCUIT TESTER

[76] Inventor: Dean A. Winkler, R.R. #4, Box 268, Loogootee, Ind. 47553

[21] Appl. No.: 878,629

[22] Filed: Feb. 17, 1978

[51] Int. Cl.² .............................................. G06F 11/04
[52] U.S. Cl. ................................... 364/580; 235/302; 324/73 R; 364/200; 364/579
[58] Field of Search ....................... 364/579, 580, 200; 235/302, 302.4; 324/73 R, 73 AT

[56] References Cited

U.S. PATENT DOCUMENTS

| | | | |
|---|---|---|---|
| 3,528,006 | 9/1970 | Davis, Jr. et al. ................. | 324/73 R |
| 3,562,644 | 2/1971 | DeWolf ............................. | 324/73 R |
| 3,764,995 | 10/1973 | Helf, Jr. et al. ................. | 364/579 X |
| 3,832,535 | 8/1974 | DeVito ............................. | 235/302 |

*Primary Examiner*—Jerry Smith
*Attorney, Agent, or Firm*—R. S. Sciascia; Paul S. Collignon

[57] ABSTRACT

An automatic tester for singularly testing a plurality of different types of standard electronic modules. A test program is written for each type of standard electronic module and this test data is stored on cassette tape. As the tester is adaptable for testing different types of modules, interface and switching matrix between the tester and the module under test is accomplished by an interface card and matrix of relays. A plurality of programmable power supplies and programmable waveform generators are provided in the tester and instructions on the cassette tape dictate the desired values and wave shapes to be supplied to a particular module under test. The cassette tape also has data which represents the acceptable output requirements of a module under test and a measurement system measures the actual outputs and a comparison is then made with the measured output and the desired output to indicate either failure or acceptance of the module under test.

6 Claims, 7 Drawing Figures

ANALOG AND DIGITAL CIRCUIT TESTER

BACKGROUND OF THE INVENTION

The present invention relates to an electronic circuit tester and more particularly to a portable circuit tester for testing standard electronic modules.

There is a constant demand for smaller electrical and electronic components, particularly in the aircraft and missile fields, as weight is of extreme importance. One concept of microelectronics which has been recently developed and which offers a great reduction in size and weight of electronic units is that of integrated circuitry which is formed on insulated bases such as glass, fused silica, or ceramic substrates. Integrated circuitry includes a number of active and passive components which are fabricated by one or more of a combination of several thin film deposition techniques onto a glass or ceramic substrate.

In order to reduce costs, expedite production, and provide a reliable electronic component, the Department of the Navy, as well as other military branches, have been engaged in a standard hardware program in which electronic plug-in modules have been developed which are capable of meeting various system requirements. One such plug-in module is shown in U.S. Pat. No. 3,243,660, entitled, "Electronic Module Assembly", which issued Mar. 29, 1966, to Leonard J. Yuska and David P. Zimmerman.

Both mechanical and electrical characteristics have been standardized in the Navy's Standard Electronic Modules Program. The basic SEM configuration is a single-span, single-thickness device having overall dimensions of 2.62 inches in width, 1.95 inches in height, and 0.290 inch in thickness. There are also provisions for multiple growth module increments for use in the development of modules of multiple span and thickness. Modules can be increased in span by increments of 3.00 inches and in thickness by increments of 0.300 inch. Mechanically, each module is comprised of a fin structure, ribs, contact pins, key pins and pin shields. The fin serves as the identification marking surface, extraction interface, and as a means for heat dissipation. Two holes are located in the module fin to aid in the removal of the module by use of an appropriate extraction tool. The ribs, at each end of the module span, aid in the alignment of the module in the card cage and assist in the proper mating of the module contacts and mounting structure connector. The ribs also provide a means for dissipating heat. The portion of each of the male contacts protruding from the header surface is configurately controlled to insure the proper engagement of the module and its interface mounting structure. The contacts are arranged in two rows of 20 contacts each on a 0.100-inch grid system to form module-connector increments. Each module increment may have a maximum of 40 contacts or a minimum of 20 contacts per module. Two keying pins serve to insure the proper mating of the module to its appropriate interface connector. Each module type is assigned a three-letter key code which identifies and establishes the configuration and rotational positions of the two uniquely configured keying pins. Modules having the same key code are both mechanically and electrically interchangeable. The pin shields function as a protective cover for the module contacts and a marking and identification surface.

In order that the basis for standardization could be effected, the standard electronic modules generally use standard digital logic levels and, also, standardized power supply voltages of $\pm 5$ Vdc, $\pm 12$ Vdc, $\pm 15$ Vdc and $\pm 25$ Vdc are used with a power supply voltage tolerance of $\pm 10$ percent. Additionally, SEM power supply, circuit ground, frame ground, and signal lines have been assigned to specific contact pins on the module connector. These requirements have been established to permit the use of commonly used power and ground bussing techniques, thereby enabling the simplification of backpanel wiring techniques.

The use of Standard Electronic Modules by the Navy has had many beneficial results such as lower design and production costs, reduced logistics cost and increased Fleet readiness by the reduction of overall inventory, and improved reliability through standardization controls invoked on the module specifications.

System level repair now requires that a technician or engineer who thoroughly understands the system under repair to trouble shoot the system with the aid of a maintenance manual and standard or special laboratory instruments. This is a time consuming method. Some of the later electronic systems contain a system self-check program. This program aids the repair by isolating the system fault to a group of modules. By replacing the suspect modules one at a time, the system self-check program can find the bad module. The disadvantage is that the self-check program is time consuming and may need to be run a great number of times before the bad module is detected.

SUMMARY OF THE INVENTION

The present invention provides a device and method for automatically testing different types of standard electronic modules. A test program is written for each type of module to be tested and this program contains information for providing the necessary inputs to a module under test and also a desired output. The actual outputs from a module under test are measured and then compared with the desired outputs to indicate either failure or acceptance of the module under test.

As the present invention provides for measuring a plurality of different types of standard electronic modules, the interface and switching matrix between the tester and the module under test is accomplished by an interface card and a matrix of relays. A plurality of programmable power supplies and programmable waveform generators are provided in the tester and instructions from the test program dictate the desired values and shapes to be supplied to a particular module under test. The test program also contains data which represents the acceptable output requirements of the module under test and a measurement system measures the actual outputs and then a comparison is made between the actual and desired to indicate either failure or acceptance of the module under test.

It is therefore a general object of the present invention to provide a device and method for testing different types of standard electronic modules.

Another object of the present invention is to provide a device and method which will simplify the maintenance and repair of systems using a plurality of standard electronic modules by locating a faulty module.

Other objects and advantages of the present invention will be readily appreciated as the same becomes better understood by reference to the following detailed description when considered in connection with the accompanying drawings.

DESCRIPTION OF THE PREFERRED EMBODIMENT

Figure 1:
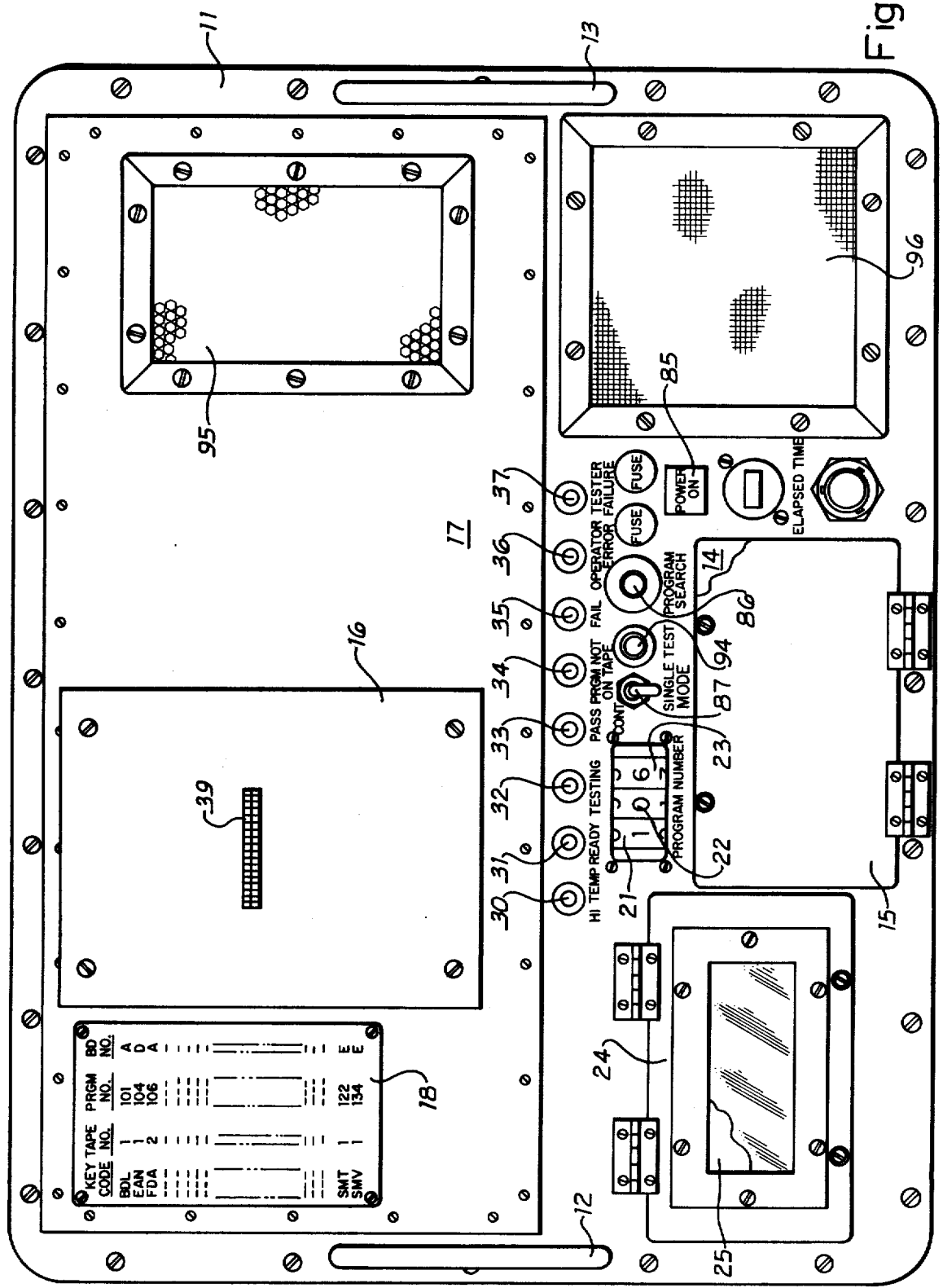
FIG. 1 is a plan view showing an embodiment of the tester mounted in a carrying case.

Referring now to the drawings, there is shown a test set which has been mounted in case 11 having handles 12 and 13 thereon. Case 11 is designed to have a cover (not shown) which will protect the tester during transportation and when not in use. A compartment 14 is provided under cover 15 for storing cassettes on which testing programs are stored and the cover is designed to carry extra interface boards 16. One interface board 16 is shown mounted in place on the case panel 17 and also an indicia plate 18 is attached to panel 17. As the tester is designed to test a plurality of different standard electronic modules (SEM), indicia plate 18 aids in the selection of tapes and interface boards 16 which are necessary for testing a particular SEM. By way of example, KEY CODE "FDA" refers to a 16-bit binary counter and in order to test this binary counter, the test operator must select interface board "A", tape No. "2", and dial in program number "106" on the three thumbwheel dials 21, 22, and 23. An exhaust fan (not shown) is mounted inside case 11 and is used to cool the electrical components within case 11. An exhaust port which is covered by an air filter 95 permits exhaust of hot air and an intake port which is covered by an air filter 96 permits entry of cool air into case 11. In the event the internal compartment temperature rises above a safe limit, circuitry power will be interrupted, but the exhaust fan will continue to run and lamp 30 will light. Normal operation will resume when the temperature drops to a safe level.

A test program for testing a particular SEM is inputted into the tester via a cassette which is loaded into the tester by raising hinged cover 24 and beneath cover 24 there is a cassette tape drive 25 which is well-known and readily available in the commercial market. The test language is abbreviated for simple and concise programming and in order to minimize the amount of program memory, only the charges to the program status are placed in the program memory. This arrangement also increases the number of test programs which can be stored on a cassette. At the beginning of each cassette there is a program library which contains the programs which are on the tape and where they are located on the tape. This arrangement eliminates the possibility of searching through the entire tape only to find that the wrong tape has been installed. A system verification test resides within the tester and this test is automatically run before every test program. In the event of a system failure, "TESTER FAILURE" lamp 37 will light and further testing will be terminated. This arrangement protects the MUT 38 from possible damage due to a malfunction of the tester.

By way of example, the following program symbols and instructions have been devised for one tester which is being built at the Naval Weapons Support Center, Crane, Indiana. It should be understood, of course, that one skilled in the art could use different symbols and instructions to accomplish the same result.

| Symbol | Use |
|---|---|
| | INSTRUCTIONS |
| 1. CLR | Opens all relays and programs all waveform generators to zero volts and all power supplies to zero volts or currents. This condition exists after power on and at the beginning of a new program. |
| 2. CPR,X,Y Activates the comparator | X specifies the comparison mode<br>X =  0 V > min<br>    1 V < min<br>    2 V > max<br>    3 V < max<br>    4 (V > min) · (V < max)<br>    5 (V < min) · (V > max)<br>    6 [(V > min) · (V < max)] + [(V < min) · (V > max)]<br>    7 [(V ≧ min) + (V ≦ max)] · [(V ≦ min) + (V ≧ max)]<br>    8 (V < min) + (V > max)<br>    9 V = min<br>    10 V ≠ min<br>    11 V = max<br>    12 V ≠ max<br>    13 No Compare<br>    14 No Compare<br>    15 No Compare<br>Y specifies the total number of points that may fail and still satisfy the test criterion, Yϵ(0,1023). This instruction utilizes the parameters specified in the last TSFT and LSFT instructions. This instruction will rarely be used, since it is a subset of the SMP instruction. This instruction operates on data existing in memory.<br>Example CPR,1,25<br>Means compare the current contents of the digitizer memory to the MIN and MAX arrays for V < min. Twenty-five or fewer failures are acceptable. |
| 3. DEVICE,TO,list, FR, list | Connects the device named to all pins named in the TO list; and disconnects it from all pins named in the FR list. FR,ALL disconnects the device from everything. The FR list may precede the TO list. Only power supplies (PSj), waveform generators (WGj), phase (PHj), and ground (GND) may appear as the device name or in either list. The current sense (CSj) and MUT pins (1-80) may only appear in the lists. Whichever is last specified takes precedence. The probe (PRB) may never appear in the lists, but only as the DEVICE.<br>Example:<br>    Connect PS2 to pins 1,5,7<br>    PS2,TO,1,5,7 |
| 4. INC,time,units | Sets the duration of one time increment for the sampling system. A time increment for the tester is the minimum time period in which waveform generators can be updated or samples taken.<br>    time is a number.<br>    unit is either MS,US, or NS for milliseconds, microseconds, or nanoseconds.<br>The minimum time per increment is 500 NS. At this period there will be 500 |

| Symbol | Use |
|---|---|
| | NS between sampled points within one window. This instruction must be executed before a SMP in order to establish a time base. The longest time increment possible is 4.096 milliseconds. The shortest is 500 nanoseconds. |
| 5. OFF,list | Turns off the power supplies specified in list. It does not alter the programmed values, but forces them to the zero value. Once the OFF instruction is executed, the devices specified in list will be set to zero volts or current; however, the relays associated with it will remain closed. The power supplies will remain in this condition until an ON,CLR, or SET, instruction referencing them is executed. Example OFF,PS1H,PS3H forces power supplies 1 & 3 to zero but does not alter the programmed value. |
| 6. ON,list | Turns on power supplies specified by list. Used for preconditioning a MUT. When this instruction is executed all programmed relays will close and the devices specified will go to their programmed levels. They will remain in this condition until an OFF, an END, or a CLR instruction is executed. Example: To send a 10 ms 5 volt pulse to pin 5 from power supply #1. PS1H,TO,5 Connect PS1 to pin 5 SET,PS1H,V = 5 Set PS1 to 5 volts ON,PS1H Turn on PS1 WAT,10 Wait 10 ms OFF,PS1H Turn off PS1 In addition, the relays may be closed directly by specifying the relay numbers preceded by an R. This requires detailed knowledge of the relay matrix and is not generally used. Example: ON,R5,R7 Closes relays 5 and 7 Use the OFF statement in the same way to open the relays. Once closed by an ON statement, those relays will remain closed until opened with an OFF statement, or reset via a DEVICE statement that requires them to be open, or a CLR. |
| 7. SET,Device P1,P2, P3,P4,P5,P6 | This instruction is used to program power supplies (PS1-PS6), waveform generators (WG1-WG3), and the MIN and MAX comparator memories. It is also used to set the range on the sampling probe. Waveform generators and MIN and MAX memories: All parameters of these devices must be specified when the device is to be updated. Device - WG1,WG2,WG3,MIN, or MAX P1 = D for digital pattern A for analog pattern R for random pattern B for binary pattern The function of the remaining parameters is determined by the value of P1. Digital Pattern (P1 = D) P2 = RANGE P3 = value of the high level voltage in volts P4 = value of low level voltage in volts P5 = a list which specifies the pattern: To specify a high level use the character H. A low level is specified by L. Each character is preceded by a number. The number specifies how many time increments to remain in the specified state. The given pattern must specify one complete period. Example: SET,WG1,D,2,5.0,0.,10L,14H,15L, 12H,13L Specifies WG1 has a digital pattern, ±10 Volt range, with a high level of 5 volts and a low level of 0 volts. The pattern is 0V 10 counts, 5V 14 counts, 0V 15 counts, 5V 12 counts, 0V 13 counts Since the waveform must be periodic in a window, i.e. an integral number of periods must fit exactly in 1024 counts, the sum of the digits must be an integral factor of 1024. That is, the sum of the digits must be one of the following values: 1024,512,256,128,64,32,14,8, 4,2,1 Any other value will result in a compiler error, and a diagnostic message will be printed. Analog waveform (P1 = A) With P1 = A, a sine wave is produced. It may have a DC offset. The phase may be selected to produce a cosine or anything in between. P2 = RANGE (See 1.7.1.6) P3 = Amplitude. One half of the peak-to-peak voltage. (Always > 0) P4 = Period. Specified as a number of time increments. P5 = Phase. Positive or negative. Specified as a number of time increments. P6 = Bias. The DC offset. The output produced is represented by: (P3) sin (360t + 360 P5) + P6 P4(inc) P4 where inc is the period of the time increment. Since an integral number of periods must fall in one window (1024 time increments), the period (P4) may only take the following values: 1024,512,256,128, 64,32,16,8,4,2,1. Any other values result in a compiler error. Example: Produce a cosine wave with pk-to-pk of 1.5V oscillating about −4.2 Volts, 2 periods per window. SET,WG1,A,2,0.75,512,128,−4.2 Random Pattern (P1 = R) With P1 = R the user may define any arbitrary waveform that will fit in one window. Its use should be limited to patterns that cannot be defined algorithmically. If the period is one full window (1024 time increments) this instruction will occupy one-third of the available memory in the tester! Use this instruction very carefully. However when programming a constant or a long period pulse, this is more efficient than the digital pattern. P2 = RANGE P3 = Pattern, the pattern is specified much as the digital pattern. The count number is followed by a voltage in parentheses. Example: SET,WG1,R,2,15(−7),2(+1.6), 3(0),4(−1.62),4(0),4(2.7) It is only necessary to specify one period. As before, the sum of the count numbers must equal one of: |

| Symbol | Use |
|---|---|
| | 1024,512,256,128,64,32,16,8,4,2,1<br>Binary Pattern (1 = B)<br>With P1 + B the users specifies a binary pattern |
| P2 = | The value of this parameter does not matter. |
| P3 = | Pattern. The pattern is specified much as the digital pattern. The count number is followed by a 2 digit HEXADECIMAL value in parenthesis. |

Example:
SET,WG1,B,2,15(AF),12(62),5(10)
It is only necessary to specify one period. As before the sum of the count numbers must equal one of: 1024,512, 128,64,32,16,8,4,2,1.
In making a current measurement the probe must be connected to the appropriate CS output and the correct MIN and MAX limit in volts must be determined.
The maximum voltage on the CS output is ±12V. The full scale voltage is ±10V. The desired voltage is the ratio of output current in ma to selected current range in ma multiplied by 10.
The range select parameter is of particular importance. In order to get a comparison it is essential that the range selected for the MIN and MAX be precisely that used for the probe.
For the waveform generators, there are only two choices, 2 and 6.
The available ranges are as follows:
1 - ±20V
2 - ±10V
3 - ±5V
4 - ±2.5V
5 - ±2.0V
6 - ±1.0V
7 - ±.5V
8 - ±.25V
SET,PRB,P1
  P1 - Range
SET,PSjk,P1 = Value,P2,P3,P4
Programs power supply number j, range k. Does not turn it on. When a power supply is to be updated, only those parameters up to and including the change must be specified.
  j = 1,2,...,6  k = H or L
P1 = I or V specifying current or voltage output
Value - The decimal value of current or voltage
If P1 = V then Value is in VOLTS
  V must be less than 12.5 and greater than −12.5
If P1 = I then
  for k = H value is in milliamps
  for K = L value is in microamps
P2 = Current range select
  P2   Full scale range
       k = H      k = L
   H  ±500mA    ±5000μA
   M  ±40mA     ±500μA
   L  ±5mA      ±50μA
  P3 = ±5V limit, yes or no (Y/N)
       The ±5V limit will only limit the output voltage when the power supply is in the current mode, but will limit the current sense output in either mode. It is recommended that the voltage limit not be used in the voltage mode. The compiler initially sets P3 to N for all supplies.
  P4 = HOLD. (H/N)
       P4 determines whether or not the power supply will be turned off be-

| Symbol | Use |
|---|---|
| | tween tests. If P4 = N (No-Hold) the supply will be forced to zero between tests. If P4 = H (Hold) the supply will remain at the programmed value between tests. Initially the compiler sets P4 = N for all supplies. P4 specification remains in effect until explicitly changed. |

Examples:
(1) Power supply 3, high range, 40mA current output no voltage limit, stay on between tests.
SET,PS3H,I = 40,M,N,H

| Symbol | Use |
|---|---|
| 8. PHj means phase signal | Example: PHj,TO,list,FR,list |

This instruction is similar to that of the power supplies and waveform generators. List contains the pin numbers to which the phase signal (PHj) is to be connected.
The values of j define four different types of pulses.
j = A - Pulse occurring at the second quarter of a time increment with a ¼ increment duration
    B - Complement of A
    C - Pulse similar to A but occurring at the third quarter
    D - Complement of C

| Symbol | Use |
|---|---|
| 9. TSFT,Z,Y | The time shift instruction is used to allow for phase shifts between the input and output comparator. It is initially set of 0,0 and this condition is assumed unless otherwise specified. The function of this instruction is to shift the data in the digitizer memory one increment at a time and perform the compare operation after each shift. Passing the test is based on passing the MIN and MAX criteria for any of the time increment shifts. MIN and MAX are to be specified at their most delayed limits.<br>X = The number of time increments in the initial offset.<br>Y = The maximum number of time increment shifts to be done during a compare. |
| 10. LSFT,X,Y,Z | The level shift instruction is used to allow for a DC bias to the comparator. It is initially set to 0 and that condition is assumed unless otherwise specified. The function of this instruction is to level shift the data in the digitizer memory between two limits. Upon each shift the data is compared to MIN and MAX. Passing the test is based on passing any of the shifted compares. For a proper use of this instruction the voltage increment should be no more than half and preferably a third of the difference between the MIN and MAX levels.<br>X = The voltage subtracted from output to produce a lower extreme.<br>Y = The voltage added to output to produce the upper extreme.<br>Z = Voltage increment to be shifted for each compare operation. Voltages are referenced to the range specified for the probe. |

X is subtracted from output and a comparison is done. If the compare fails Z is added to the current value of the output and a compare is done. If the compare fails the process repeats. This continues n times were n is the minimum value such that X = nZ > Y. When this inequality is satisfied the

| Symbol | Use |
|---|---|
| | process stops and the MUT fails. This is nearly identical to a FORTRAN DO loop, i.e. DO 20 J = X,Y,Z. Each time a level shift is done, all time shifts (TSFT) specified are also done. |
| 11. SMP,X,Y,$T_1$,$T_2$, DEL, SLENGTH, SAMP | SMP is the SAMPLE instruction. This instruction programs the probe to the desired delay, sets up the desired compare mode and number of failures to accept without failing the module. This instruction doesn't initiate sampling. The SMP instruction shall always be followed by the END instruction unless a COPY instruction is used. When a change in the SMP instruction is required only those parameters up to and including the change must be specified.<br>X = The compare mode (See CPR instruction)<br>Y = The maximum number of failure points acceptable<br>$T_1$ = 1,2,3, or 4<br>Specifies quarter periods of an address time. That is, each time increment of the waveform generator is divided into four equal periods. $T_1$ specifies which of these is to be the sampling period for the probe.<br>$T_2$ = 0,15,30,45,60,75,90,105<br>Specifies a further division of the time increment in nanoseconds. It is a delay in nanoseconds from the beginning of the specified quarter period.<br>Delay = 0,1,2,3, ...<br>Specifies the number of waveform windows to wait initially before activation the probe; used for preconditioning.<br>SLENGTH = 1,2,3, ...<br>Specifies the number of windows that constitute a test sequence.<br>SAMP = 1,2,3, ... ≦ SLENGTH<br>Specifies which window in SLENGTH is to be sampled.<br>Example:<br>The delay time of an inverter is to be checked. Its time is specified to be 25 NS maximum.<br>TEST, 38 |
| C | Pin 1 is Vcc |
| PS1H,TO,1 | PS1H is connected to pin 1 |
| SET,PS1H,V = 5.0, H,N | |
| WG1,TO,2 | WG1 is connected to pin 2 |
| SET,WG1,D,2,2.0, 0.8,1L,1H | Alternate 1's and 0's |
| PRB,TO,3 | |
| SET,PRB,3 | ±5 Volt RANGE selected |
| SET,MIN,D,3,2.4, 0.01,1L,1H | The MAX levels will be alternate 0.1V and 5.0V levels and the MIN levels will be alternate 0.1V and 2.4V levels. |
| C | |
| SMP,4,0,1,30,0, 1,1 | |
| C | |
| C | The sampling will occur 30 NS after the first quarter phase. The probe will sample the first window and only one window will constitute a test. No failures are allowed for the module to pass and the data |
| C | |
| C | |
| C | |
| C | |
| END,38 | |
| C | |
| C | |
| C | |

| Symbol | Use |
|---|---|
| | must lie between the MIN and MAX limits. On this instruction relays are closed, the devices are activated and the sampling is done. After the test relays remain closed, PS1H goes to zero volts. |
| 12. WAT,time | Causes a delay. Time is in milliseconds. Resolution is to .2ms. |
| 13. COPY and ICOPY | These instructions are used to insert assembly language instructions into the compiler output to produce functions unavailable via the test language itself.<br>The format for both is:<br>COPY,N,file name<br>ICOPY,M,file name<br>File name is any ligitimate DX-10 or Librarian file name which already exists and contains valid assembly source code.<br>N is the number of words of object code produced by that file when it is assembled.<br>COPY,N,file name<br>Causes the file to be copied after taking a sample if mode is "no-compare". That is, as long as the compare mode is 13, 14, or 15 the file will be recopied after every sample. The first occurrence of any other compare mode will stop the copy. To restart it another COPY instruction must be used.<br>ICOPY,N, file name<br>Causes the file to be copied immediately under all conditions. |
| | END,2   Do another   FILE RMS<br>TEST,3   FFT   FILE Subroutine for RMS<br>COPY,RMS   Do RMS<br>END,3      Calculation<br>TEST,4<br>SMP,8, ...      FILE BOTH<br>COPY,BOTH   COPY,FFT<br>END,4      COPY,RMS<br>ENDPG<br>It is not advisable for these routines consist attempt to use the system user workspace. Thus one may define a workspace in the routine (requires labels) for a routine used only once, or use the system executive workspace WP3. In addition the user may utilize many of the executive symbols and system routines. |
| 14. PAR,P1,P2,P3 | PAR describes a system of parallel entry to and exit from the module under test (MUT). It consists of 12 bit binary counter/register, another 16 bit register and control signals. All voltage levels are restricted to Standard TTL levels.<br>The counter/register may be preloaded to any value and is then incremented on each clock cycle (of INC) during the sampling operation. The counting function may be disabled during any test. Typical use of this instruction is in the testing of ROMS and RAMS. The 16 bit register is divided into 2 parts; 8 inputs and 8 outputs. The data on the inputs originates from waveform generator 1 (WG1) memory. The output data is stored and compared via the 8 output bits.<br>The control signals consists of positive or negative TTL level pulses which |

| Symbol | Use |
|---|---|
| | occur during the second and third quarters of a clock cycle. The duration of these pulse is a ¼ of the quarters of a clock cycle. The duration of these pulse is a ¼ of the quarter cycle on ⅛ of the total clock cycle. Once the pulses have been enabled there is additional control which can be placed upon them. The pulses are ANDED with the appropriate bits of waveform generator 2 (GW2) memory. By this method it is possible to use a control signal to enable a chip select on a RAM. By storing alternate 1's and 0's the chip would be enabled on alternate clock cycles. |
| 15. SKP,N SKF,N | SKIP on pass, SKIP on fail. These two instructions cause the tester to continue whether a test fails or passes. They have the format: SKP, test number    Skip on pass to test number. SKF, test number    Skip on fail to test number. If the condition is met, a skip causes relay closures and programming to occur normally, but no sampling or comparing is done until the destination test number is reached. If the condition is not met, testing occurs as programmed. Only a single skip may be in effect at any time. |

DIRECTIVES

| Symbol | Use |
|---|---|
| 1. BRD, number | BRD is the second statement of every program. Supplies the tester with the number of the proper interface board for this program. It occurs once and only once per program. Number is hexadecimal between 0 and F. A non-contiguous relative record file having the name BOARD N, where n is number specified above, must exist on the system disk. This file contains the relay matrix information needed to make connections. The system file named, PINLST, when installed and executed will build this file. |
| 2. Cb comment | A C followed by a blank space indicates that the line is to be ignored by the processor. This provides a way for the programmer to insert documenting comments into the program stream. Example: C now measures the prop delay. |
| 3. END,test number | Signifies the end of the test specified by test number. When this instruction is executed it causes all connections specified in the proceeding TO statements to be implemented (throws relays), brings up power supplies, starts waveform generators, and starts the probe. When the sample is complete the comparator is activated if called. The result is a pass or fail indication. All devices for which hold = H remain at their programmed value. Example: END,5 end of test #5 |
| 4. ENDPG | Denotes the end of an entire program. Informs the compiler to stop processing. |
| 5. JMP,N | This instruction is only utilized during debugging. It does the following: (1) Disables all power supplies, generator, probe, and comparator. (2) Causes all other instructions to be executed. (3) When it reaches a TEST, N directive the stimulus devices are enabled. The result is a JUMP from the JMP, N instruction to the TEST, N instruction in such a way that all relays and settings have the same status they would have if the stimuli were enabled. This is used to skip portions of a program that execute properly in order to concentrate on the faulty area of code. |
| 6. LOOP;UNLOOP | Those directives may occur anywhere. It causes the sampling system to continuously execute the END instruction, allowing meter or scope measurements to be made at the interface board pins for verification of voltage levels and waveforms. The loop is interrupted by typing C RETURN on the system console device. An "A" aborts execution. In the DEBUG mode the compiler always generates a loop unless it encounters an UNLOOP. From that point on it generates NO loops until it encounters another LOOP. This directive has no effect unless DEBUG is selected. |
| 7. PGM,Leheres, number | Denotes the beginning of a program. Supplies the task identification number that is set on the thumbwheel of the suitcase tester and the module key code needed by the tester. This must be the first statement of every program and must appear only once. "Number" is a 3 digital decimal number right justified and zero filled. The LETTERS parameter is a six (6) character string having no inbedded blanks. It is used in the IDT parameter of the object file for later linking to the executive. Example: PGM,ABJONE,007 |
| 8. STOP | Causes execution to stop. Leaves status of all devices unchanged. Used for making DC measurements at the MUT pins for debugging. Execution is resumed by typing G RETURN on the system console. Only effective in the DEBUG mode. Example: SET PS1H,V = 8.0,M,N,H ON,PS1H STOP OFF,PS1H SMP,4,0,1,0,1,2,2 END,108 |
| 9. TEST,N | Signifies the beginning of test number N. |

Figure 2:
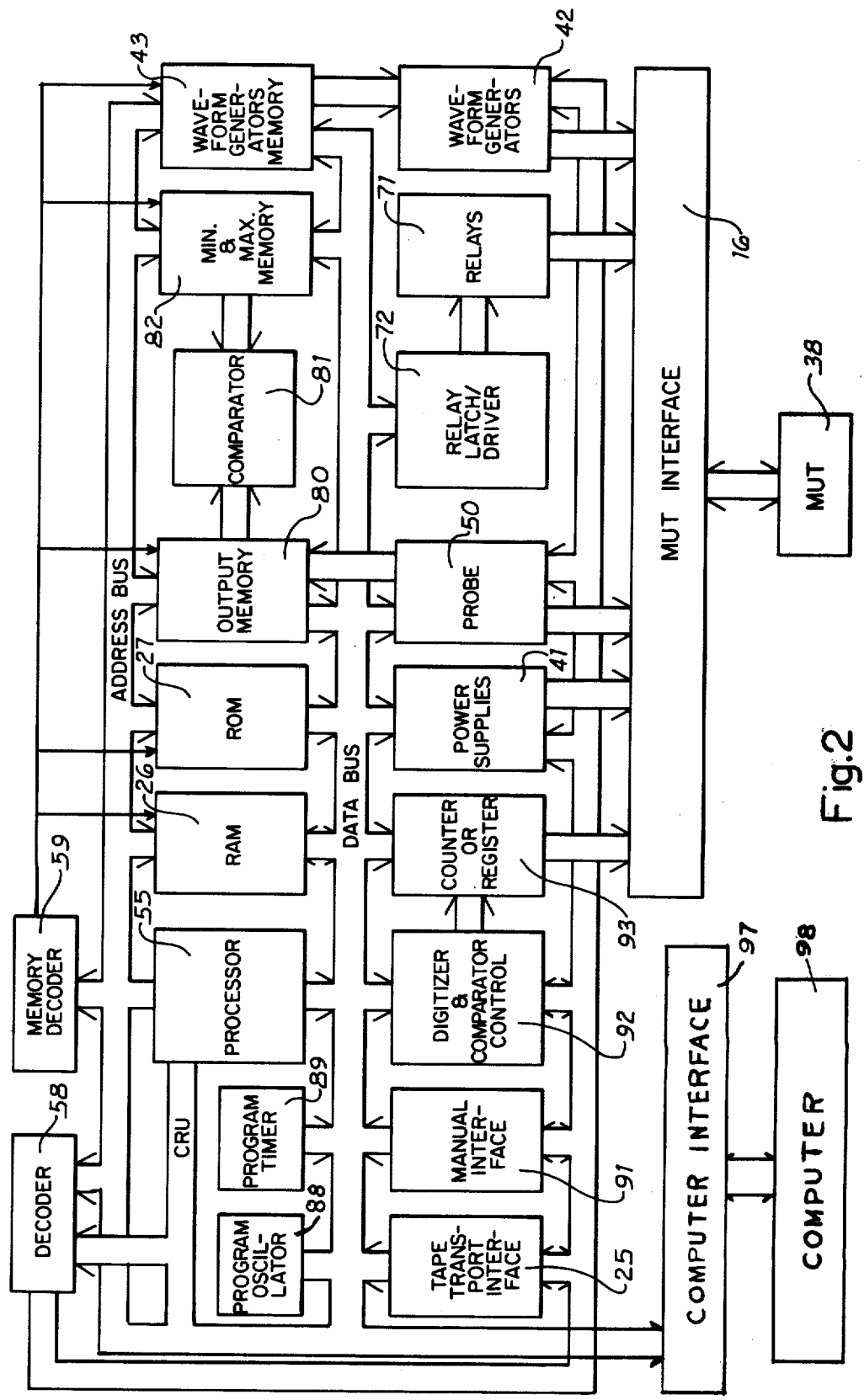
FIG. 2 is a block diagram of a preferred embodiment of the present invention.

Referring now to FIG. 2 of the drawings, with the selected cassette tape engaged in the tape transport interface 25, the selected test program is loaded into the random access memory (RAM) 26. A second memory 27, which is a read-only memory contains permanent information for conducting a self-testing of the tester and also contains a permanent executive program for directing the proper lights on panel 17 to be lit. These lights, which are numbered 31 through 37 indicate respectively, "ready", "testing", "pass", program not on tape, "fail", "operate error" and "tester failure". The following list will explain the meaning of the lamps, when lit:

| LAMP | FUNCTION |
|---|---|
| READY | Indicates when tester is ready for next operation. |
| TESTING | Indicates when a test program is being executed. |
| PASS | Indicates when module under test has passed all tests. |
| PROGRAM NOT ON TAPE | Indicates that either the wrong tape was selected or an erroneous program number was selected with the THUMBWHEEL switch. |
| FAIL | Indicates when module under test has failed to pass all tests. |
| OPERATOR FAILURE | Indicates one or more of the following conditions: No tape in tape transport; tape incorrectly installed tester does not have all power supplies or waveform generators; incorrect interface board selected. |
| TESTER FAILURE | Indicates one or more of the followin conditions: damaged tape; tape incorrectly read; tester does not have all power supplies or waveform generators; power supply or waveform generator malfunction. |

Figure 3:
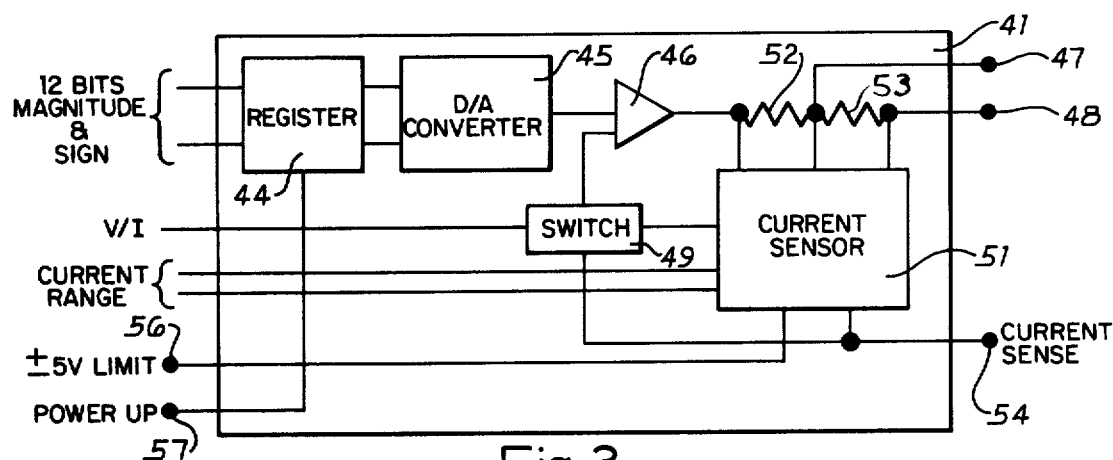
FIG. 3 is a block diagram showing power supplies in greater detail.

Referring again to FIG. 2 of the drawings, the module under test (MUT) 38 is plugged into the selected interface board 16 which has a female connector 39 suitable for accepting a module under test. Interface board 16 connects with a plurality of relays which, by way of example, might be 298 uncommitted relays which are available to be programmed. The interface board 16 and relays provide the interface and switching matrix necessary between the tester and MUT 38. The relays are used to connect tester stimulies and the measurement system to the various pins of MUT 38 and, by way of example, a logic "0" might be used to close a selected relay and a logic "1" might be used to open a selected relay. A plurality of power supplies 41 and a plurality of waveform generators 42, which are programmed by the waveform generators memory 43, also interface with board 16. By way of example, the power supplies 41 might be comprised of six programmable power supplies and the waveform generators 42 might be comprised of three programmable waveform generators. In addition, one ±15 V power supply and one +5 V power supply are provided and are connected to the various components. FIG. 3 of the drawings shows the power supplies 41 in greater detail. Digital register 44 stores a 12-bit word which represents either a voltage or a current and the output from converter 45 is amplified by amplifier 46 and goes to ports 47 and 48. As the supply can be programmed either as a voltage source or a current source, switch 49 is provided to select the desired mode and current sensor 51 is connected across resistors 52 and 53 to provide a current sense at terminal 54. The programmable power supplies 41 are programmed via a digital word supplied by processor 55. As a voltage source, the output is programmable in approximately 7.5 mV increments to a full scale deflection of ±12.5 V. As a current source, the supply has a maximum output of ±500 mA. Output port 47 can drive a maximum of ±500 mA and output port 48 can drive a maximum of ±5 mA. The programmer can select either port 47 or port 48 to be connected to the MUT 38 and port 47 has a +500 mA, ±50 mA, and a ±5 mA, full scale range. Port 48 has a ±5 mA, ±0.5 mA and a ±50 μA full scale range. All of the ranges are programmable in increments of 1/2048 of full scale.

As a voltage source, there is only one ±12.5 V range and this voltage is programmable in increments of approximately 7.5 mV. This voltage is available at both output ports 47 and 48. The current sense output at port 54 is a voltage which is linearly proportional to the current flowing in output ports 47 and 48. The current sense output is programmable to the same ranges as the current source. The full scale deflection of the current sense output is ±10 V and the current sense output at terminal 54 is available to probe 50 (measurement system) via the interface card 16. The "±5 V limit" input at terminal 56 will limit the output voltage to ±5 V when in the current source mode and the "power up" input at terminal 57 is used to return the output to zero volts or zero current without altering the program status.

By way of example, processor 55 might be a TMS 9900 microprocessor which is built and sold by Texas Instruments Inc. Digital Systems Division, Austin, Texas. The TMS 9900 microprocessor is a single-chip 16-bit central processing unit which uses N-channel silicon-gate MOS technology. The TMS 9900 microprocessor utilizes a versatile direct command-driven Input/Output (I/O) interface designated as the communications-register unit (CRU). The CRU provides up to 4096 directly addressable input bits and 4096 directly addressable output bits. Associated with the processor 55 is a CRU decoder 58.

Figure 4:
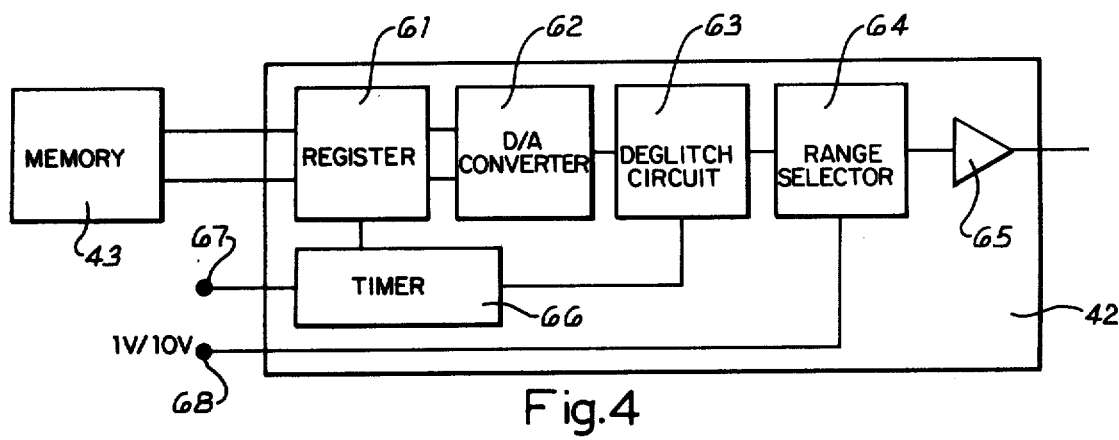
FIG. 4 is a block diagram showing waveform generators in greater detail.

Referring now to FIG. 4 of the drawings, the waveform generators 42 is shown in greater detail. The desired waveforms are stored in memory 43 and the selected waveform is loaded into a holding register 61 which is provided to minimize skewing effects into the digital-to-analog converter 62. The digital-to-analog converter 62 transforms the digital waveform into an analog waveform. The output waveform is deglitched by circuit 63 and buffer 65 is a current amplifier capable of driving heavy capacitive loads. The waveform generator has two ranges which can be inputted at terminal 68. One range is a ±10 V and the other is a ±1 V. The switching time or update time is accurately set in order to make time delay measurements and the waveform generator, like the power supply, has an input which forces the output to zero volts in order to power down the MUT between tests and while delays 71 are being switched.

Figure 5:
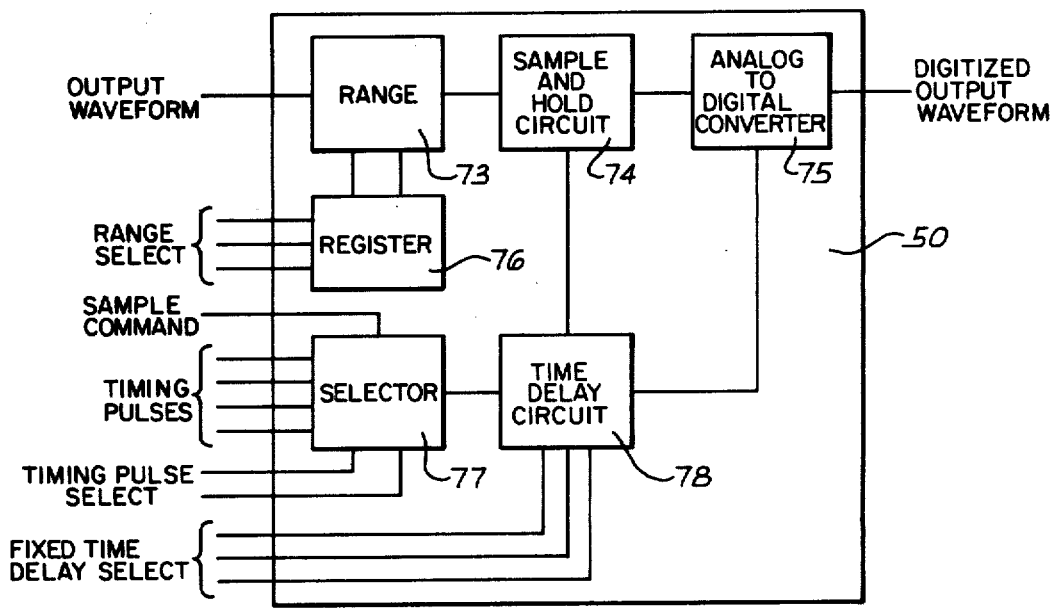
FIG. 5 is a block diagram showing a measuring system in greater detail.

Referring now to FIG. 5 of the drawings, there is shown, in greater detail, the probe 50 which is used to perform all absolute measurements. Probe 50 is used to make both dynamic and static measurements, and, by way of example, the input impedance of probe 50 is 1 meg ohms, and has a 1 MH$_z$ bandwidth. The probe makes all measurements with reference to system ground and has eight voltage ranges from ±250 mV to ±20 V full scale. The sampling system controls probe 50 by providing a sample command to the probe. Upon receipt of a sample command the probe samples the incoming waveform and stores the sampled voltage for a conversion to a digital word. The exact time of the sample is set within probe 50. In this manner, like the waveform generator, any probe may be placed in a tester without a calibration procedure. Also contained within probe 50 is a choice of eight fixed sampling time delays. These are 0, 15, 30, 45, 60, 75, 90, and 105 nS. These fixed delays are used in making MUT response time measurements. The sample is initiated from one or four possible timing pulses. The selection of timing pulses is made within the probe and is defined by two inputs to probe 50.

It is the responsibility of the sampling system to properly digitize the MUT waveform. To accomplish this, the sampling system issues sampling commands and determines when the sampling procedure is complete. The sampling system is initiated by a "start" command and, upon completion of the sampling procedure, a "sampling complete" signal is issued. The sampling system is designed to output four timing pulses. These four pulses are one fourth of a time increment apart. The probe will key its sample from one of these pulses. The selection of pulses is under program control and, at the proper time, the sampling system issues a sampling command to the probe and stores the time increment as a pointer to define where to place the data from probe 50 when the analog-to-digital conversion is complete. The sampling system also defines the timing for the waveform generators 42. The speed at which the sampling system and waveform generators operate is defined by the length of a time increment. The time increment is under program control and is the clock to the dynamic systems. During the sampling procedure, the sampling system communicates with processor 55, and processor 55 sends a command which defines whether or not to sample the MUT in the next window. The sampling system gives processor 55 a timing pulse which defines the boundaries of the window. The time increment is the base of the dynamic systems within the tester and is the updating time of the waveform generators.

OPERATION

In operation, the preferred embodiment of the invention described herein is designed to facilitate testing of high usage standard electronic modules, however, it should be understood, that many other types of circuits might be readily tested without departing from the scope of the invention. Referring now to FIG. 1 of the drawings, the power cord for the tester is plugged into a standard 115 V, AC, 60 $H_z$ outlet, and switch 85 is depressed to an "ON" position. Lamps 31 through 37 will first flash on and off several times and will then turn off, and then the "READY" lamp 31 will light and remain on. Assuming, for purposes of illustration, that a standard electronic module having the key code "FDA" is to be tested, indicia plate 18 shows that tape number "2", program number "106" and board number "A" should be used. Cassette tape number "2" is then removed from storage compartment 14 and placed in tape transport 25. Next, the program number "106" is programmed by use of thumbwheel switches 21, 22, and 23. The program search button 86 is pressed and the proper program from the cassette tape is loaded into memory 26 and, after the program is loaded into the memory, "READY" lamp 31 will light.

Interface board 16 which, for our example, would be board "A", is attached to the tester and the module to be tested (MUT 38) is plugged into connector 39. The mode switch 87 is then switched to either the "SINGLE" mode or the "CONTINUOUS" mode. The test button 94 is next depressed and "TESTING" lamp 32 will light. If in the "CONTINUOUS" mode, the tester will continue testing until the mode switch is reset to the single position or a fault is detected. If left in the "CONTINUOUS" mode and no fault is detected, the "PASS" lamp 33 will turn on for a brief period each time all the tests are completed. If in the "SINGLE" mode, the tester will discontinue after performing all tests and either the "PASS" lamp 33 or the "FAIL" lamp 35 will light.

Figure 7:
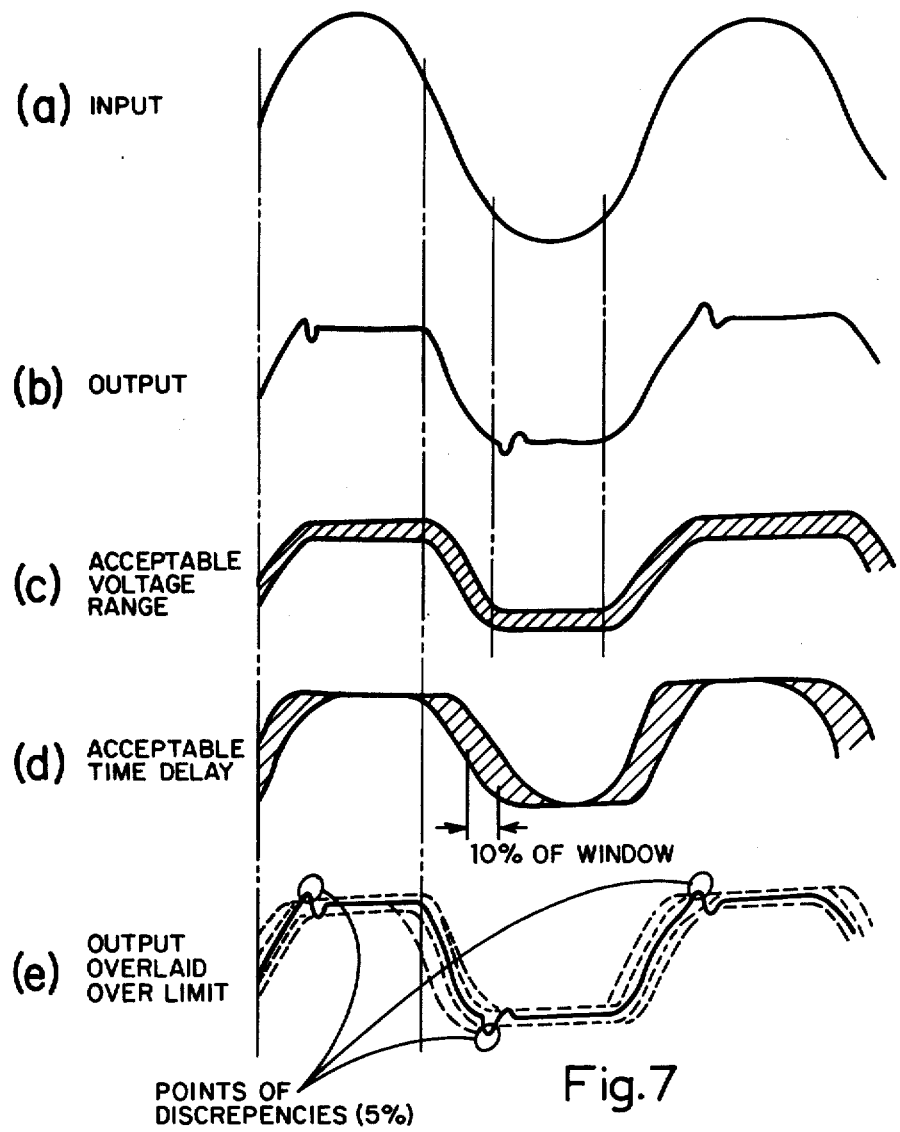
FIG. 7 are waveform diagrams showing operation of the present invention.

By way of example, FIG. 7 of the drawings illustrates how a comparison test might be used. The diagrams shows the comparison in analog form, however, the tester actually makes a digital test. FIG. 7(a) shows an input waveform and FIG. 7(b) denotes the output waveform. The window time increment is programmed from the programmable oscillator 88. FIG. 7(c) shows an acceptable output voltage range, and FIG. 7(d) shows an acceptable time delay. The tester takes the output waveform and overlays it over an acceptable output voltage, as shown in FIG. 7(e). The number of points permissible to fall outside the waveform is programmable and the tester will "FAIL" the module if the number of points which fall outside exceed the number programmed. In the example shown in FIG. 7(e), the points of discrepancy are 5% and if less than 5% of the data were allowed to fail, the tester will light "FAIL" lamp 35.

Figure 6:
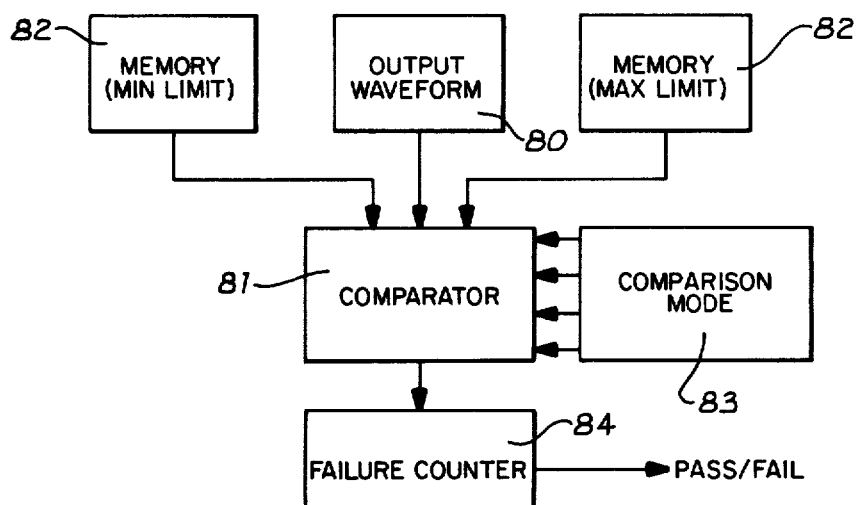
FIG. 6 is a block diagram showing a comparison system in greater detail.

Referring specifically to FIG. 2 of the drawings, the outputs from probe 50 are stored in memory 80 and compared by comparator 81 with the desired maximum and minimum limits which are stored in memory 82. FIG. 6 of the drawings, shows greater details of the comparison system. Unlike most testers which can measure only one parameter at a time, the present invention can test for a number of parameters within one test. After the MUT 38 waveform has been digitized, it is stored in memory 82 and the comparison system compares the MUT 38 waveform to an acceptable envelope. With this form of comparison, the timing and voltage levels of MUT 38 can be verified at 1024 points.

The above-described tester is designed as a portable instrument and can be readily moved to a test area and used as a maintenance and trouble shooting tool. As best shown in FIG. 2 of the drawings, however, the tester can also be connected through a computer interface 97 to a computer 98. By way of example, computer 98 might be a 990/10 minicomputer, which is built and sold by Texas Instruments, Incorporated, Austin, Texas. Computer 98 houses the test language compiler and editor and also links with the tester to perform initial test program debug and checkout.

It can thus be seen that the present invention provides a device for testing a plurality of electronic modules which can be used by a technician having only limited skill and that the device provides a "PASS"—"FAIL" indication for a module being tested. Although the preferred embodiment described herein has been discussed with respect to testing standard electronic modules, it should be understood that the present invention is adaptable for testing electronic circuits other than standard electronic modules.

Obviously many modifications and variations of the present invention are possible in the light of the above teachings. It is therefore to be understood that the invention may be practiced otherwise than as specifically described.

I claim:

1. A portable analog and digital circuit tester for singularly testing an electronic module selected from different types of electronic modules comprising, a plurality of programmable direct current power supplies, a plurality of programmable waveform generators, an interface board and a plurality of relays for selectively connecting said programmable direct current power supplies and said programmable waveform generators with a selected electronic module to be tested, cassette tape means in said tester for storing data representing a plurality of testing programs for different types of electronic modules, means for selecting a particular testing program from said cassette tape means for storing data for the electronic module selected for testing, a first memory in said tester for storing data from said selected testing program representing output parameters for an acceptable selected electronic module, central processing means in said tester directed by said selected testing program for selectively energizing said selected electronic module from said programmable direct current power supplies and said programmable waveform generators, a second memory in said tester, probe means for measuring the output parameters of said selected electronic modules being energized and storing the measured output parameters in said second memory, means for comparing stored data in said first memory representing output parameters of an acceptable electronic module with stored data in said second memory representing the measured output parameters of the electronic and module being tested, and means connected with said means for comparing for indicating that said selected electronic module passes or fails the selected testing program.

2. A portable analog and digital circuit tester for singularly testing an electronic module selected from different types of electronic modules as set forth in claim 1 having means for self-testing said circuit tester prior to testing a selected electronic module.

3. A portable analog and digital circuit tester for singularly testing an electronic module selected from different types of electronic modules as set forth in claim 1 having means for selecting either a single testing mode whereby said tester stops testing after completing one test or a continuous testing mode whereby said tester keeps repeating the same tests.

4. A portable analog and digital circuit tester for singularly testing an electronic module selected from different types of electronic modules as set forth in claim 1 having means for indicating that a particular selected testing program is not stored on said cassette tape means for storing data.

5. A portable analog and digital circuit tester for singularly testing an electronic module selected from different types of electronic modules as set forth in claim 1 having means for programming the number of errors permissible for a particular test.

6. A portable analog and digital circuit tester for singularly testing an electronic module selected from different types of electronic modules as set forth in claim 9 having interface means for temporarily connecting said circuit tester to a computer for writing and checking test programs.

* * * * *